(12) United States Patent
Capici et al.

(10) Patent No.: US 6,346,847 B1
(45) Date of Patent: Feb. 12, 2002

(54) ELECTRONIC CIRCUIT AND CORRESPONDING METHOD FOR TRIMMING AN IC

(75) Inventors: Salvatore Capici, Barrafranca; Filippo Marino, Tremestieri, both of (IT)

(73) Assignee: STMicroeletronics S.r.l., Agrate Brianza (IT)

( * ) Notice: Subject to any disclaimer, the term of this patent is extended or adjusted under 35 U.S.C. 154(b) by 0 days.

(21) Appl. No.: 09/660,775

(22) Filed: Sep. 13, 2000

(30) Foreign Application Priority Data

Sep. 14, 1999 (EP) ............................................. 99830579

(51) Int. Cl.[7] .......................... H07H 37/76; H07H 85/00
(52) U.S. Cl. .......................................... 327/525; 327/63
(58) Field of Search .............................. 327/52, 56, 59, 327/60, 63, 68, 72, 89, 90, 525, 560, 561, 563, 564, 565

(56) References Cited

U.S. PATENT DOCUMENTS

| | | | |
|---|---|---|---|
| 4,843,339 A | * 6/1989 | Burt et al. | 330/10 |
| 4,972,517 A | * 11/1990 | Kondou et al. | 327/110 |
| 5,539,771 A | * 7/1996 | Noda et al. | 375/219 |
| 5,671,183 A | 9/1997 | Soenen et al. | 365/189.12 |
| 5,798,667 A | * 8/1998 | Herbert | 327/513 |
| 5,977,803 A | * 11/1999 | Tsugai | 327/94 |
| 6,072,349 A | * 6/2000 | Pippin et al. | 327/307 |

* cited by examiner

Primary Examiner—My-Trang Nuton
(74) Attorney, Agent, or Firm—Lisa K. Jorgenson; Allen, Dyer, Doppelt, Milbrath & Gilchrist, P.A.

(57) ABSTRACT

An integrated circuit includes a first access pin and a second access pin, and an electronic circuit for trimming a portion of the integrated circuit. The electronic circuit includes a memory element, and a regulation circuit for modifying the memory element. The regulation circuit includes an error amplifier for comparing an output voltage of the portion of the integrated circuit to be trimmed with an internal voltage reference. A comparator includes a first input connected to an output of the error amplifier and to the first access pin. A first switch is connected between the output of the error amplifier and the first input of the comparator. A second comparator includes a first input connected to the second access pin, and an output connected to the first switch for control thereof. A second switch is connected to the output of the error amplifier and to the first access pin. A serial interface is connected to the second switch for receiving via the first access pin a data sequence relating to trimming the portion of the integrated circuit. A control logic circuit is connected to the serial interface for controlling the trimming based upon the received data sequence.

34 Claims, 3 Drawing Sheets

ELECTRONIC CIRCUIT AND CORRESPONDING METHOD FOR TRIMMING AN IC

FIELD OF THE INVENTION

The present invention relates to integrated circuits and, more particularly, to an electronic circuit and method for trimming an integrated circuit.

BACKGROUND OF THE INVENTION

When a high accuracy level is required of an integrated circuit, additional circuit portions must be associated with the circuit for the purpose of modifying certain circuit parameters at the integrated circuit testing stage. This modifying operation is commonly referred to as trimming.

The parameter modifications are usually performed at a wafer testing stage. Integrated circuits are fabricated in wafers formed of a semiconductor material, and an electrical wafer sort (EWS) test is conducted on the wafer prior to separating the circuits for subsequent packaging operations.

In special cases, trimming may also have to be carried out at the device final testing stage. One example of a circuit that requires this type of modification would be a step-down switching voltage regulator as commonly used in a variety of applications on account of its efficiency and accuracy.

New-generation regulators are to exhibit higher switching frequencies and allow for the use of smaller-size external components so as to keep their space requirements and cost low. In particular, the latter requirements involve a minimum presence of the necessary external components. Also required is a high accuracy throughout the operational range (e.g., supply voltage, temperature, etc.), and by reason of the required accuracy, certain basic parameters of a device must be further trimmed after the device packaging.

Prior approaches to modifying certain circuit parameters after the packaging step are known. These approaches essentially amount to using memory elements, wherein the information needed for trimming is saved. Such memory elements may be, for example, Zener diodes of the ZAP type. A feature of these components is that they operate as open circuits so long as the voltage thereacross does not exceed a predetermined threshold value. Upon this threshold value being exceeded and a large current is conducting, e.g., a few hundred milliamperes, the ZAP diode permanently changes its characteristic. In particular, the ZAP diode changes into a resistive component having a few ohms.

Another approach for modifying certain circuit parameters after the packaging step includes using integrated fuses which change their state, from short circuit to open circuit, upon an appropriate current being conducted therethrough. Yet another approach is integrated non-volatile memories, e.g., EEPROMs, EPROMs, etc., wherein an appropriate sequence of bits is stored for later use in forcing certain integrated microswitches to the closed or open state by suitable circuitry.

The above approaches do have merits, but also some deficiencies. The two approaches first mentioned above have the advantage of requiring no complicated managing circuitry. In fact, the fuses can be set by forcing a voltage and/or a current, but they need dedicated contact pins for addressing individual components at the EWS testing stage. In particular, additional pins must be specially provided for post-packaging trimming purposes.

There also have been approaches for minimizing the number of additional pins. For example, European Patent Application No. 98830521.5 discloses a method whereby the pins can be reduced in number as compared to other prior approaches, i.e., down to that of the trimming circuits plus one. This application is incorporated herein by reference in its entirety, and is assigned to the assignee of the present invention.

The methods based on the use of integrated memories actually require less pins. In fact, only two additional pins are needed. One each for a serial data input and for forcing the device to enter the trimming mode. In some cases, the additional two inputs can be obtained by utilizing a third logic level on a pin of the integrated circuit.

For example, by raising the voltage at a given pin above its specified upper limit, a comparator operates and places the circuit in the trimming mode. The internal data line can then be connected to the given pin once this is disconnected from the line to which it was connected in normal operation. In this way, all the circuitry needed for managing the trimming operations can be enabled.

This operation is usually carried out through the Reset and Enable pins. For example, RESET is taken away from the managing logic, and ENABLE is given to the affected analog portion. Such methods, although keeping the required number of pins low, have disadvantages as specified below.

They require more silicon area for the trim and memory write managing circuitry. This can be a problem where a large number of parameters are to be trimmed. With devices fabricated with mixed technologies, such as BCD technologies, the fabrication of integrated memories involves the addition of at least three extra masks to the basic process, which is cost-intensive.

With integrated circuits having a small number of pins, selecting the two pins to be used from the available ones and checking the state of the others may prove difficult. This is especially so when it is considered that the entire operation is to be carried out in real time.

Finally, there is a problem of simulating the effects of trimming. After the data is entered, but before it is permanently written into the memory, the effects of the trimming operation about to be carried out must be simulated. The simulation includes closing and/or opening internal switches and measuring the values of the parameters to be trimmed. The measurement often requires that the device condition be that of a normal operation so that a pin being used for entering the trim mode must be allowed to operate as normal. However, this results in the trim managing circuitry going out of control.

SUMMARY OF THE INVENTION

In view of the foregoing background, an advantage of the invention is to provide a trimming system with suitable structural and functional features for the trimming operations to be carried out in a straightforward manner, similar to a fuse arrangement but with no need for additional pins beyond those already provided in the integrated circuit to be trimmed.

This and other advantages and features are provided by an electronic circuit for carrying out a trimming operation on portions of an integrated circuit which are provided with at least first and second access terminals. The electronic circuit comprises memory elements, a regulation circuit for modifying, either temporarily or permanently, the state of the memory elements.

More particularly, the regulation circuit may include an error amplifier for comparing an output voltage of the portion of the integrated circuit to be trimmed with an internal voltage reference. A comparator may be provided which includes a first input connected to an output of the error amplifier and to the first access pin. A first switch may be connected between the output of the error amplifier and the first input of the comparator.

A second comparator may be provided which includes a first input connected to the second access pin, and an output connected to the first switch for control thereof. A second switch may be connected to the output of the error amplifier and to the first access pin. A serial interface may be connected to the second switch for receiving via the first access pin a data sequence relating to trimming the portion of the integrated circuit. A control logic circuit may be connected to the serial interface for controlling the trimming based upon the received data sequence.

The first and second switches are preferably in phase opposition. That is, the first switch is normally closed, and the second switch is normally open. An output of the second comparator may be connected to the serial interface, and the second switch may be controlled by an output of the second comparator. The control logic circuit further comprises a synchronous state machine connected downstream from the serial interface.

BRIEF DESCRIPTION OF THE DRAWINGS

The features and advantages of an electronic circuit and a method according to the invention can be more clearly understood by reading the following description of embodiments thereof, given by way of non-limiting examples with reference to the accompanying drawings.

DETAILED DESCRIPTION OF THE PREFERRED EMBODIMENTS

Figure 2:
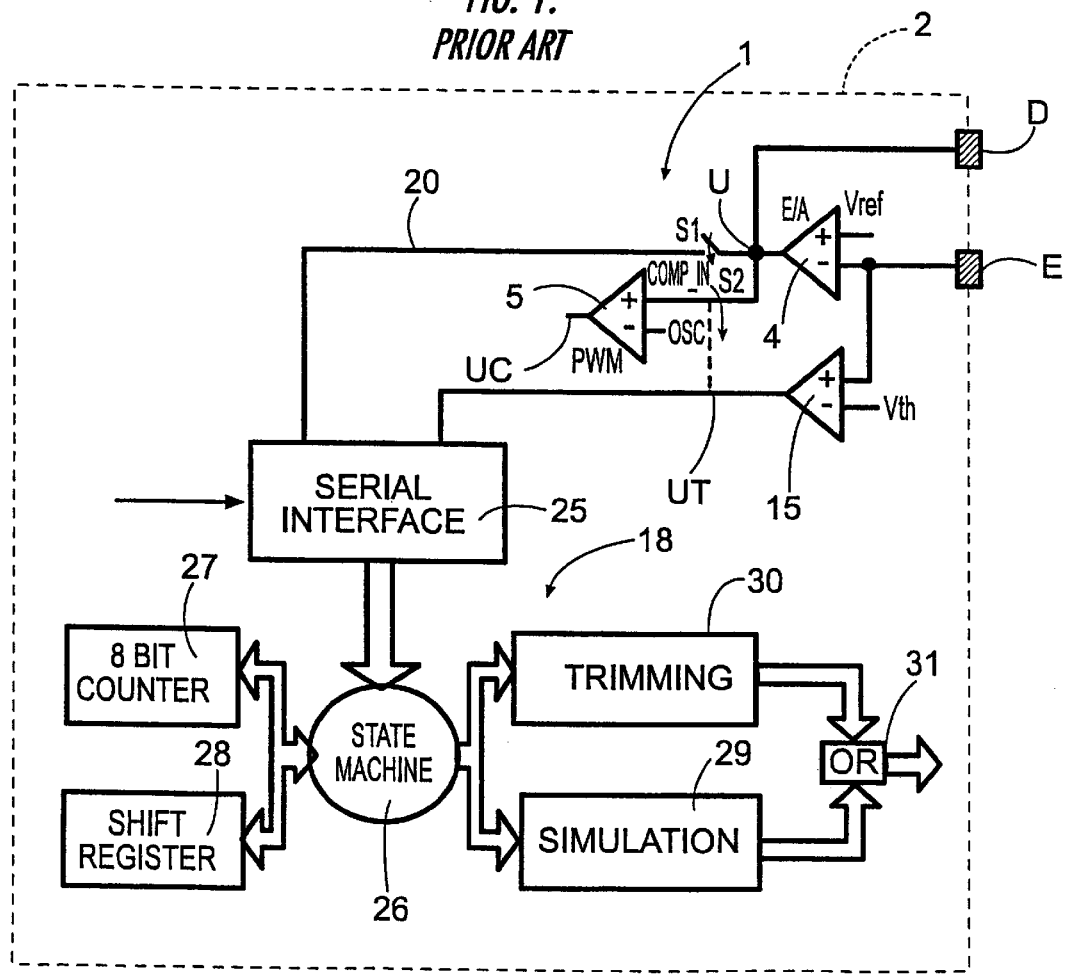
FIG. 2 illustrates a schematic diagram of a trimming device according to an embodiment of the present invention.
Figure 3:
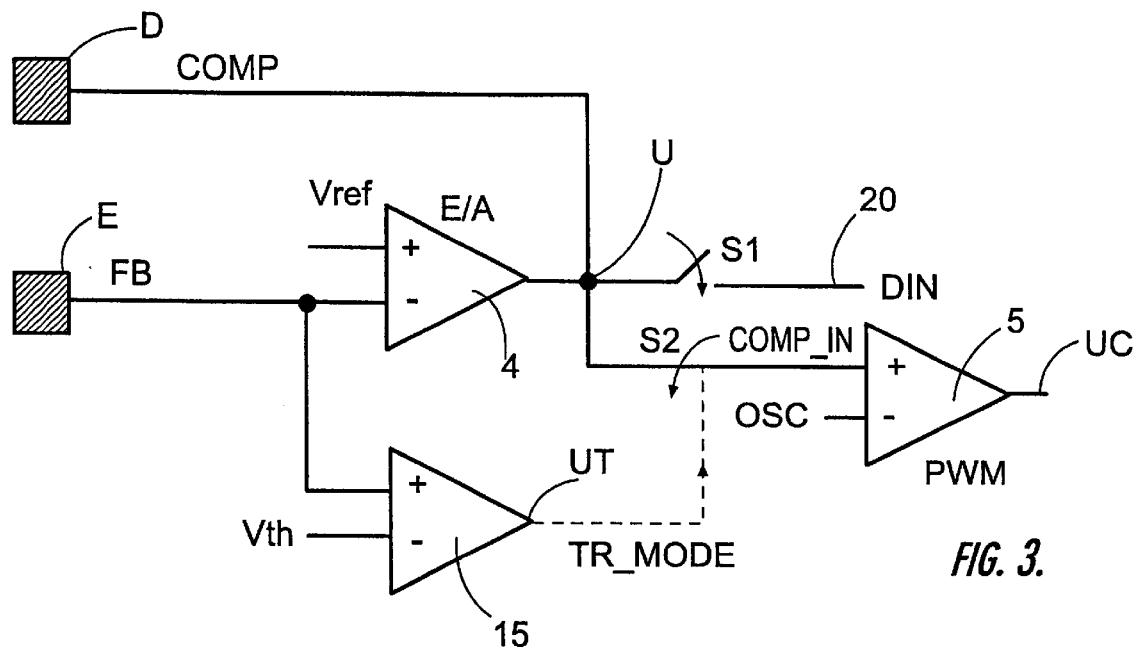
FIG. 3 illustrates a schematic diagram of a portion of the trimming device illustrated in FIG. 2.

Referring to the drawing figures, and particularly to the example of FIG. 2, an electronic circuit according to the present invention for carrying out a trimming operation in an integrated circuit 2 is generally shown at 1 in schematic form. The integrated circuit 2 may be a DC/DC step-up or step-down voltage controlled converter having a regulating loop 3. However, the device of this invention can be associated with other types of integrated circuits.

Figure 1:
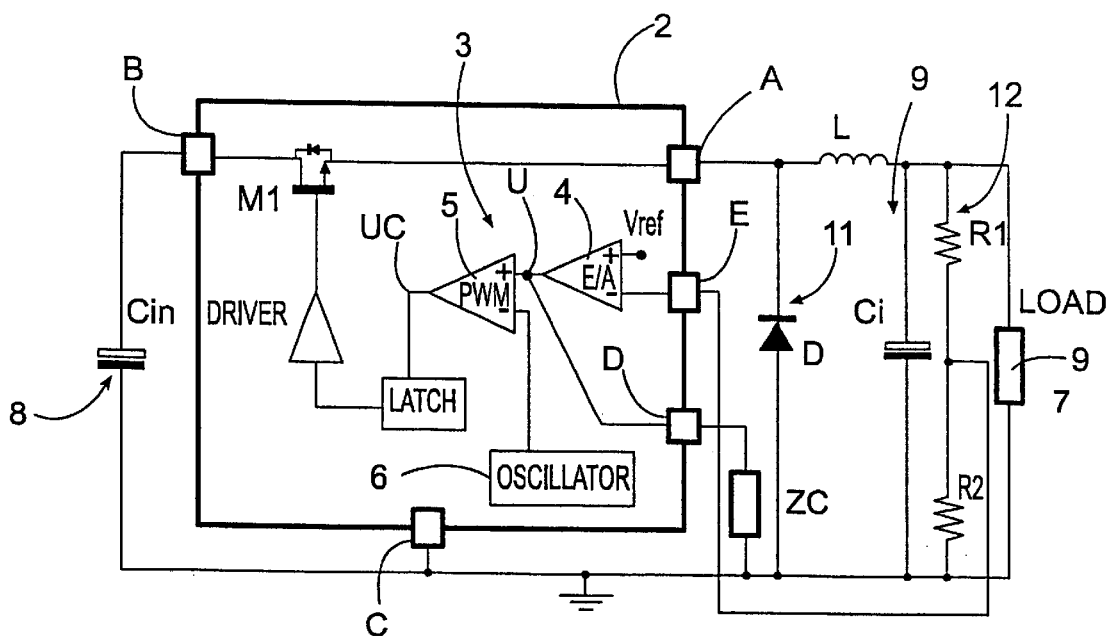
FIG. 1 illustrates a schematic diagram of a trimming device associated with an integrated circuit according to the prior art.

FIG. 1 is a schematic block diagram of the regulating loop 3 of the voltage controlled converter 2. The integrated circuit 2 has five pins, hereinafter referenced as pins A, B, C, D and E. These pins have the following functions: pin A is an output OUT pin, pin B is a power supply input pin for providing a voltage Vin, pin C is a ground pin for connecting to a ground reference GND, pin D is a signal COMP pin, and pin E is a sense pin for detecting the output voltage Vout.

The regulating loop 3 comprises an error (E/A) amplifier 4 that compares the output voltage, or a division thereof, with an internal voltage reference Vref. The amplifier 4 delivers a signal COMP through its output U. This signal is applied to a non-inverting input of a PWM comparator 5. The comparator 5 has a second inverting input which receives a saw-tooth signal from an oscillator 6 within the circuit 2.

The comparator 5 has an output UC providing a logic signal whose duty cycle varies with the magnitude of the error detected by the amplifier 4. This logic signal is used to drive a power switch M1 connected between the pins A and B of the circuit 2. The power switch M1 is driven through a series connected latch (Latch) and a drive circuit portion (Driver).

External to the circuit 2 is a load 7 (Load), an input filter 8 represented by a capacitor Cin, an output filter 9 represented by a circuit portion LCi, a one-direction element 11 represented by a loop-back diode D, and an optional resistive divider 12 to divide the input voltage Vin. This divider 12 is formed from a series of resistors R1 and R2. Also provided is a compensation network ZC for the entire regulating loop 3.

Advantageously, the pins D and E of the integrated circuit 2 are used for entering the circuit 2 in the trim mode. The pins D and E are also used for serially entering the related data. Once this data is processed, the circuit 2 will also allow a simulation of the trimming sought, its associated measurements, and the actual trimming to be made.

Shown schematically in FIG. 2 is the circuit arrangement provided by this invention, whereby the two pins D, E of the circuit 2 can be utilized for trimming purposes without losing control of their operation, and with the power switch positively held in the off state through the duration of the trimming step.

The error amplifier 4 output is connected to the comparator 5 via a normally closed controlled switch S2. The switch S2 is driven by the output UT from a comparator 15 having a first, non-inverting input connected to pin E, and having a second, inverting input maintained at a threshold voltage value Vth.

Another controlled switch S1 is provided between the output U of the amplifier 4 and a serial interface 25. This interface is inside the circuit 2 and is adapted to receive the data sequence pertaining to the trimming operation. The switch S1 is placed in line 20 for connecting the output U to the serial interface 25. This switch S1 is normally open and is driven by the same signal used for driving the switch S2. The switches S1 and S2 are essentially in phase opposition.

In the normal mode of operation, the potential at pin E would never reach the threshold value Vth, which value is advantageously set, at the designing stage, to a higher safe value than the reference voltage Vref. Accordingly, the signal TR-MODE at the output U of the comparator 15 will be low throughout. In this condition, the switch S1 will be open, the signal DIN is low, and the switch S2 is closed to connect the compensation pin D to the non-inverting input of the comparator 5.

In this way, one can be assured of the trim managing circuitry being fully transparent to the application. In fact, the signal TR-MODE represents an asynchronous resetting of the entire trim managing system.

To enter the trim mode, the potential at pin E should be raised, from external, to a value above the threshold Vth. In this case, the switch S2 opens while the other switch S1 closes since the signal TR-MODE is high. The pin D is connected to the internal line 20 representing the serial data input DIN for the system which is for managing the trimming, as will be described below.

During this step, control of the state of the power switch M1 is not lost because the open switch S2 would force to ground the non-inverting input of the comparator 5. The latter forces the power transistor M1 to the off state. According to the present invention, the structure just described is cooperating with a control logic, generally referenced by 18, to drive an analog trim actuator 19.

Also shown in FIG. 2 is a block diagram of the circuit portions which are part of the control logic 18, which are arranged to manage the data sequence being delivered to the circuit for the simulated or actual trimming operation. The serial interface 25 receives the externally provided data from pin D over the internal line 20. The signal TR-MODE, driven from pin E, represents the resetting of the entire trimming circuitry.

A synchronous state machine 26 is provided for managing and coordinating all the trimming operations. The state machine 26 is connected bidirectionally to an eight-bit counter 27. This counter is provided for decoding the data sequence received from pin D, as well as to a shift register 28 wherein the decoded bits are stored. The shift register 28 is, preferably, but not necessarily, a fifteen-bit shift register wherein the serial input data to the line 20 are stored.

The state machine 26 output drives a simulation block 29 managing the simulated trimming, and a trimming block 30 which executes the actual trimming. The respective outputs from the blocks 29 and 30 are addressed to an OR node 31 for re-constructing a single trim output signal. The data receive timing, and that of the subsequent operations, is provided by an internal clock of the integrated circuit 2 since the simulation or trimming operations are all carried out in real time.

Figure 4:
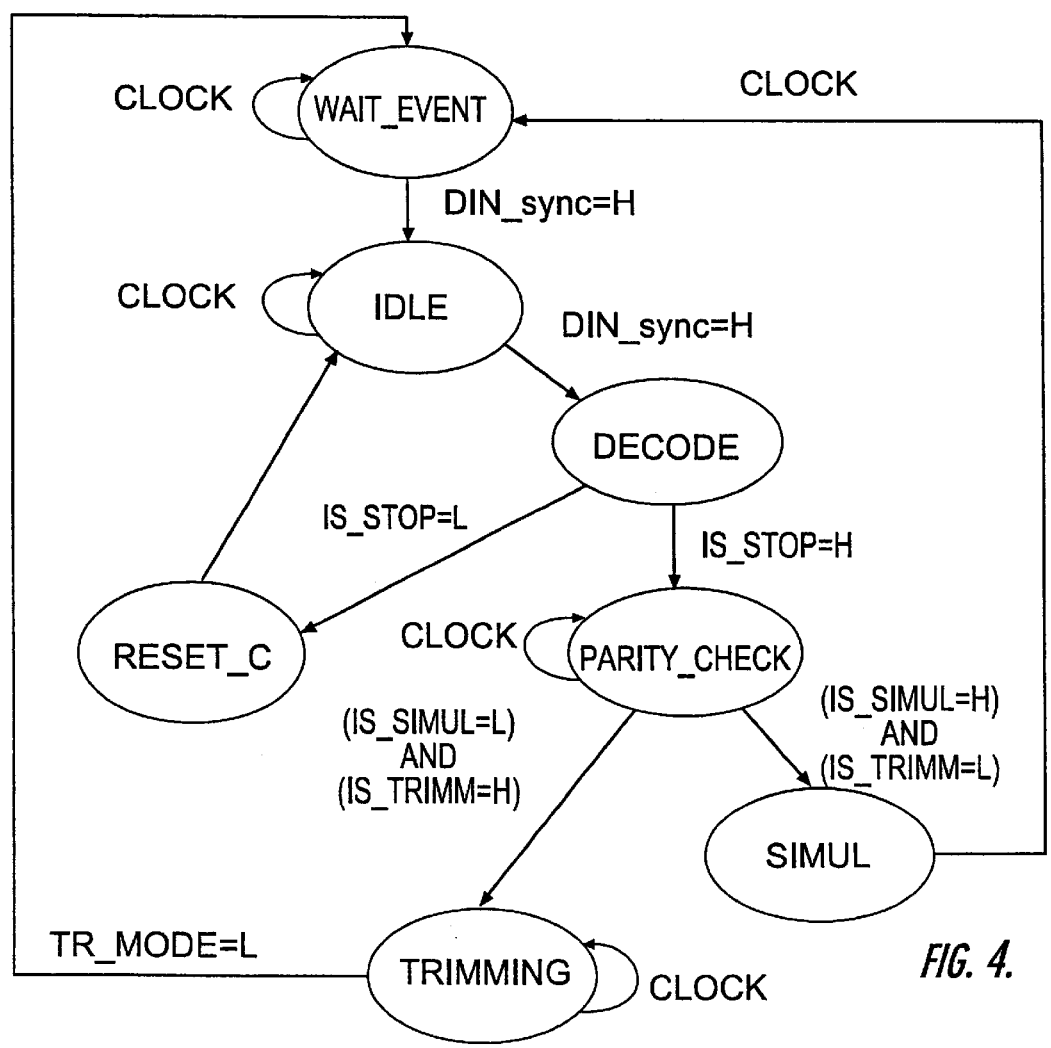
FIG. 4 illustrates a flow chart for a trimming method according to an embodiment of the present invention.

More particularly, as shown schematically in FIG. 4, the state machine 26 carries out sequentially operations which are clocked by a clock period CLOCK supplied by the integrated circuit 2. The state machine 26 is held in a WAIT_EVENT initial state until it receives a first positive edge of the input signal.

A sequence of N bits is entered from external the integrated circuit 2. That is, through pin D according to the rules of the trim protocol being implemented. In essence, the values 0, 1, and the sequence end (STOP) are discriminated according to the distance between the leading edges contained in the input signal.

Of the N bits in the sequence, M (M<N) bits represent the state sought for the fuses, K bits are intended for the user to select simulated or actual trimming, and T bits are for an optional safety system (parity, error correction code, etc.). The N bits are equal to M+K+T. In this instance, the assumed values are M=12, K=2, and T=1.

At the initial stage, the signals delivered to the input D are checked (decoded) to indicate if a logic 0 or 1 or a STOP value has been entered. Thus, the counter 27 is enabled to count, as indicated by the state IDLE in FIG. 4. The count is continued until a new edge of the input data is detected. The state DECODE is then attained in which the counter 27 is stopped and the input data is decoded.

If the number detected by the counter 27 is less than 64, then a logic high (H) is attributed to a signal IS_ZERO. As the counter 27 counts beyond 64, the signal IS_ZERO is brought to a logic low (L) and a signal IS_ONE to a logic high. This data is transferred to the input of the shift register 28. If a stop is detected, a signal IS_STOP would be brought to a logic high, and control is handed down via a parity check incorporated in the control logic 18.

A pair of flags IS_SIMUL and IS_TRIMM allow the control logic 18 to manage the simulated or actual trimming steps. Dependent on the logic values of these flags and the outcome of the parity check performed on the contents of the register 28, control is handed down to either block 29 or block 30.

If the flag IS_SIMUL is a high logic value and the flag IS_TRIMM a low logic value, block 29 is enabled to store the associated information into an internal register and carry on with the trimming step. Since for the fuse trimming step one switch must be closed at a time, as required to hold the transistor M1 closed for a longer time than the clock period, the signal DIN on the line 20 will be acting as a clock for the operations within block 30. The duration of the ON state on line 20 is the same as the duration of a switch closure.

Figure 5:
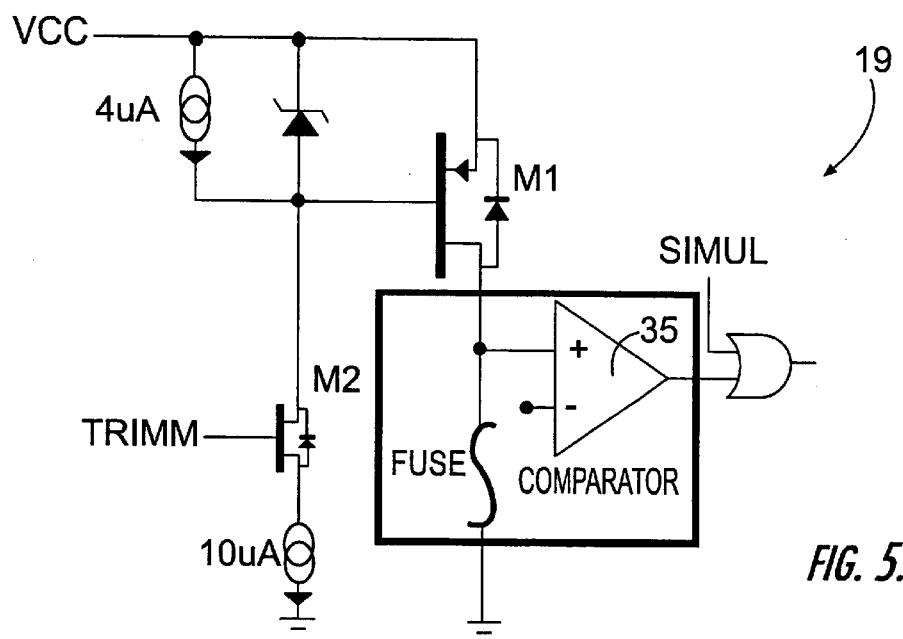
FIG. 5 illustrates a schematic diagram of an analog actuator incorporated in an electronic circuit according to an embodiment of the present invention.

At the end of the trimming operations, control is restored to the initial state WAIT_EVENT after the signal TR_MODE is forced to a logic low. To complete the description, a diagram of the analog actuator 19 which enables the trimming is shown in FIG. 5 by way of example.

In the simulation aspect, the signal SIMUL has a high logic value and, accordingly, the switch represented by the NMOS transistor M1 will be closed, regardless of the comparator 35 output to permit a temporary modification of the parameter considered. When a trimming operation is to be carried out, the signal TRIMM will be at a logic high and the switch M1 is closed to conduct a sufficient current of about 170 mA to blow the fuse FUSE.

Figure 6:
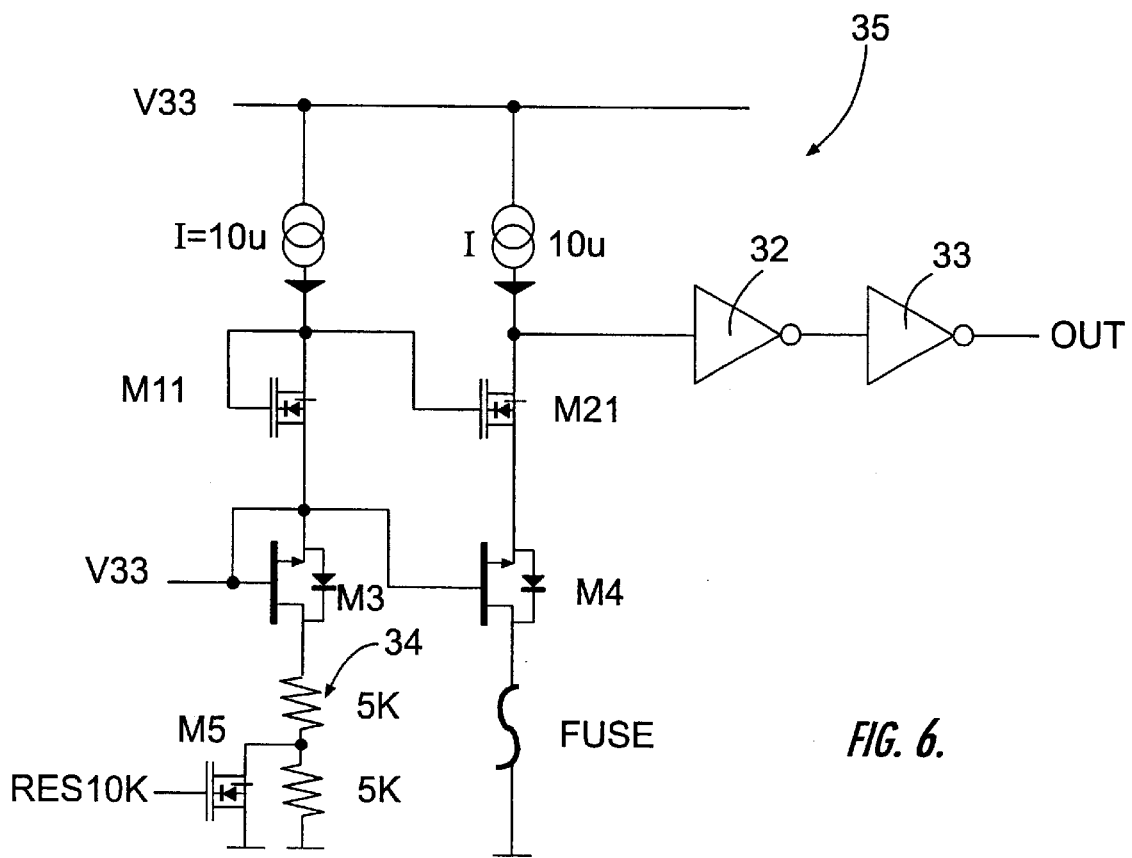
FIG. 6 illustrates in greater detail the schematic diagram of the analog actuator illustrated in FIG. 5.

The output UC of the comparator 35 will change from a low into a high state in a permanent fashion. To prevent reliability problems resulting from using fuses, the comparator circuit structure 35 shown in FIG. 6 is discriminately charged between an intact fuse and a blown one. With BCDV technology, a blown fuse is not always indicative of an open circuit, and occasionally may represent a resistance of a few hundred kohms. In addition, this value is likely to deteriorate, more often decrease, over the life span of the device.

The comparator circuit structure 35 of FIG. 6 ensures a correct logic level for the output, even when the fuse is not an open circuit. A first pair of parallel-connected DMOS transistors M3 and M4 are provided for this purpose. A first transistor M3 in the pair is connected to ground GND via a resistive divider 34, which comprises at least a pair of resistors of equal resistance, e.g., 5 kohms.

The first transistor M3 in the pair is further connected to the supply via a series connection of a transistor M11 in diode configuration and a current I generator. A transistor M5 connects the point of interconnection of the divider resistors to ground GND, and receives a signal RES10K on its control terminal.

The second transistor M4 in the pair is connected to ground GND via the fuse FUSE. The second transistor M4 in the pair is further connected to the supply via a series connection of a transistor M21 and a second current I generator. The control terminal of the transistor M21 is connected to the interconnection node between the transistor M11 and the first current I generator.

The comparator output OUT is picked up from the interconnection node between the transistor M21 and the second current I generator through a series connection of two inverters 32 and 33. During the trimming step, the signal RES10K would be low, and the current I through the diode M11 and the series of the divider resistors generate a voltage reference level for all the fuses. The DMOS transistors M3 and M4 function to protect the circuitry as the fuse FUSE is being blown, since during this event, the supply voltage is applied across the fuse. The voltage drop Vgs through the transistor M4 is effective to protect the whole circuitry.

When the fuse FUSE is intact, its resistance amounts to a few ohms, e.g. 5 ohms. The transistor M21 exhibits a higher voltage drop Vgs than that of the corresponding transistor M11, and will force the input of the first inverter 32 to a logic low. This ensures an output OUT of 0 Volts. When, on the contrary, the fuse FUSE is badly blown, the circuit structure 35 only outputs a high logic value if the resistance of the fuse exceeds that of the series resistors in the divider 34. Thus, based on this indication provided by the value of the output OUT, any such indications that may become a source of problems from the potential deterioration of the fuse resistances can be rejected at the trimming stage.

The signal RES10K, by controlling the resistive value of the divider 34, allows the resistance of the fuse FUSE to be compared, at the trimming stage, with a higher resistive value of the divider. Whereas in normal operation of the circuit, the comparison can be made with a lower resistive value.

The advantages of this innovative approach can be summarized as follows. The trimming can be performed after the packaging step without having to introduce additional pins, and while keeping the state of the power switch under control. The system can be used with EWS without any additional pads inside the device. This provides considerable savings in silicon area because the entire system can be implemented using logic components at a high level of integration density. In addition, another advantage is that the outcome of the trimming can be simulated.

That which is claimed is:

1. An integrated circuit comprising:
   a plurality of pins including a first access pin and a second access pin; and
   a trimming circuit comprising a memory and a regulation circuit for modifying said memory, said regulation circuit comprising
      an error amplifier having a first input for receiving an internal voltage reference, and a second input connected to the second access pin for receiving an output voltage from a portion of the integrated circuit to be trimmed, said error amplifier for comparing the output voltage with the internal voltage reference,
      a comparator having a first input connected to an output of said error amplifier and to the first access pin,
      a first switch connected between the output of said error amplifier and the first input of said comparator,
      a second comparator having a first input connected to the second access pin, and an output connected to said first switch for control thereof,
      a second switch connected to the output of said error amplifier and to the first access pin,
      a serial interface connected to said second switch for receiving via the first access pin data for trimming the portion of the integrated circuit, and
      a control logic circuit connected to said serial interface for controlling the trimming based upon the received data.

2. An integrated circuit according to claim 1, wherein said regulation circuit temporarily modifies said memory.

3. An integrated circuit according to claim 1, wherein said regulation circuit permanently modifies said memory.

4. An integrated circuit according to claim 1, wherein said first switch is normally closed, and said second switch is normally open.

5. An integrated circuit according to claim 1, wherein said second comparator has an output connected to said serial interface.

6. An integrated circuit according to claim 1, wherein said second switch is controlled by an output of said second comparator.

7. An integrated circuit according to claim 1, wherein said control logic circuit further comprises a synchronous state machine connected downstream from said serial interface.

8. An integrated circuit according to claim 7, wherein said control logic circuit further comprises a counter connected to said state machine, and wherein said memory comprises a shift register connected to said state machine.

9. An integrated circuit comprising:
   a plurality of pins including a first access pin and a second access pin; and
   a trimming circuit comprising a memory and a regulation circuit for modifying said memory, said regulation circuit comprising
      an error amplifier for comparing an output voltage from a portion of the integrated circuit to be trimmed with a voltage reference,
      a comparator having a first input connected to an output of said error amplifier and to the first access pin,
      a first switch connected between the output of said error amplifier and the first input of said comparator,
      a second switch connected to the output of said error amplifier and to the first access pin, and
      an interface connected to said second switch for receiving via the first access pin data for trimming the portion of the integrated circuit.

10. An integrated circuit according to claim 9, further comprising a control logic circuit connected to said interface for controlling the trimming based upon the received data sequence.

11. An integrated circuit according to claim 10, wherein said regulation circuit permanently modifies said memory.

12. An integrated circuit according to claim 10, wherein said first switch is normally closed, and said second switch is normally open.

13. An integrated circuit according to claim 10, wherein said control logic circuit further comprises a synchronous state machine connected downstream from said interface.

14. An integrated circuit according to claim 13, wherein said control logic circuit further comprises a counter connected to said state machine, and wherein said memory comprises a shift register connected to said state machine.

15. An integrated circuit according to claim 9, further comprising a second comparator having a first input connected to the second access pin, and an output connected to said first switch for control thereof.

16. An integrated circuit according to claim 15, wherein said second comparator has an output connected to said interface.

17. An integrated circuit according to claim 15, wherein said second switch is controlled by an output of said second comparator.

18. An integrated circuit according to claim 9, wherein said regulation circuit temporarily modifies said memory.

19. A step-down switching voltage regulator comprising:
   a plurality of pins including a first access pin and a second access pin; and
   a trimming circuit comprising a memory, and a regulation circuit for modifying said memory, said regulation circuit comprising
      an error amplifier for comparing an output voltage of the step-down switching voltage regulator with a voltage reference,
      a comparator having a first input connected to an output of said error amplifier and to the first access pin,
      a first switch connected between the output of said error amplifier and the first input of said comparator,
      a second switch connected to the output of said error amplifier and to the first access pin, and an interface connected to said second switch for receiving via the first access pin data for trimming the step-down switching voltage regulator.

20. A step-down switching voltage regulator according to claim 19, further comprising a control logic circuit connected to said interface for controlling the trimming based upon the received data.

21. A step-down switching voltage regulator according to claim 19, further comprising a second comparator having a first input connected to the second access pin, and an output connected to said first switch for control thereof.

22. A step-down switching voltage regulator according to claim 19, wherein said regulation circuit temporarily modifies said memory.

23. A step-down switching voltage regulator according to claim 19, wherein said regulation circuit permanently modifies said memory.

24. A step-down switching voltage regulator according to claim 19, wherein said first switch is normally closed, and said second switch is normally open.

25. A step-down switching voltage regulator according to claim 19, wherein said second comparator has an output connected to said interface.

26. A step-down switching voltage regulator according to claim 19, wherein said second switch is controlled by an output of said second comparator.

27. A step-down switching voltage regulator according to claim 19, wherein said control logic circuit further comprises a synchronous state machine connected downstream from said interface.

28. A step-down switching voltage regulator according to claim 27, wherein said control logic circuit further comprises a counter connected to said state machine, and wherein said memory comprises a shift register connected to said state machine.

29. A method for trimming a portion of an integrated circuit comprising at least a first access pin and a second access pin, and a trimming circuit comprising a memory and a regulation circuit for modifying the memory, the method comprising:

comparing an output voltage of the portion of the integrated circuit to be trimmed with a voltage reference using an error amplifier;

comparing an output of the error amplifier with an oscillating signal using a comparator;

forming a connection between the output of the error amplifier and a first input of the comparator using a first switch;

comparing a voltage on the second access pin with a threshold voltage reference using a second comparator, and an output of the second comparator being connected to the first switch for control thereof;

forming a connection between the output of the error amplifier, the first access pin and an interface using a second switch;

providing data for trimming the portion of the integrated circuit via the second switch; and controlling the trimming based upon the received data using a control logic circuit connected to the interface.

30. A method according to claim 29, wherein the memory element is temporarily modified.

31. A method according to claim 29, wherein the memory element is permanently modified.

32. A method according to claim 29, wherein the first switch is-normally closed, and the second switch is normally open.

33. A method according to claim 29, wherein the second comparator includes an output connected to the serial interface.

34. A method according to claim 29, further comprising controlling the second switch via an output of the second comparator.

* * * * *